(12) United States Patent
Fifield et al.

(10) Patent No.: US 6,348,827 B1
(45) Date of Patent: Feb. 19, 2002

(54) PROGRAMMABLE DELAY ELEMENT AND SYNCHRONOUS DRAM USING THE SAME

(75) Inventors: John A. Fifield, Underhill; Nicholas M. van Heel, Burlington; Mark D. Jacunski, Winooski; David E. Chapman, Shelburne; David E. Douse, Hinesburg, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/501,216

(22) Filed: Feb. 10, 2000

(51) Int. Cl.[7] .............................................. H03H 11/26
(52) U.S. Cl. ........................ 327/278; 327/284; 327/288
(58) Field of Search ................................ 327/108, 261, 327/263, 264, 276, 277, 278–281, 284, 285, 288, 392, 393, 394, 399, 400, 401; 326/57, 58, 83

(56) References Cited

U.S. PATENT DOCUMENTS

| | | | |
|---|---|---|---|
| 4,742,331 A | 5/1988 | Barrow et al. | 341/152 |
| 4,879,505 A | 11/1989 | Barrow et al. | 323/312 |
| 5,081,380 A | 1/1992 | Chen | 327/262 |
| 5,216,302 A | 6/1993 | Tanizawa | 327/157 |
| 5,544,113 A | 8/1996 | Kirihata et al. | 365/200 |
| 5,561,636 A | 10/1996 | Kirihata et al. | 365/201 |
| 5,563,819 A | 10/1996 | Nelson | 708/819 |
| 5,600,605 A | 2/1997 | Schaefer | 365/233 |
| 5,610,546 A * | 3/1997 | Carbou et al. | 327/261 |
| 5,650,739 A | 7/1997 | Hui et al. | 327/262 |
| 5,661,419 A * | 8/1997 | Bhagwan | 327/8 |
| 5,732,030 A | 3/1998 | Dorney | 365/200 |
| 5,783,961 A * | 7/1998 | Zhou et al. | 327/85 |
| 5,841,296 A | 11/1998 | Churcher et al. | 326/49 |
| 5,886,946 A | 3/1999 | Ooishi | 365/233 |
| 5,889,727 A | 3/1999 | Hsu et al. | 365/233 |
| 5,892,719 A | 4/1999 | Kanagawa | 365/200 |
| 6,097,233 A * | 8/2000 | Schneider er al. | 327/281 |

* cited by examiner

Primary Examiner—Toan Tran
Assistant Examiner—Quan Tra
(74) Attorney, Agent, or Firm—Schmeiser, Olsen & Watts; Richards A. Henkler

(57) ABSTRACT

A programmable delay element includes a current source field-effect transistor (FET), a switch device, a precharge device, and an inverter device. The current source FET gates a programmable, predetermined amount of current. The switch device, which is coupled to the current source FET, receives an input signal having a first and second voltage level. The precharge device precharges the node coupled to the drain of the current source FET when the input signal is at a second voltage level. The inverter device, which is also coupled to the drain of the current source FET, outputs a delayed signal when the input signal is at a first voltage level, the delay of the delayed signal defined by the programmable, predetermined amount of current. The inverter device generates an inverter switch point that is substantially independent of parametric sensitivities, such as temperature variations. Also, the relative placement of the current source FET to the switch device of the present invention allows the programmable delay element to quickly reach a linear and predictable state of operation.

6 Claims, 6 Drawing Sheets

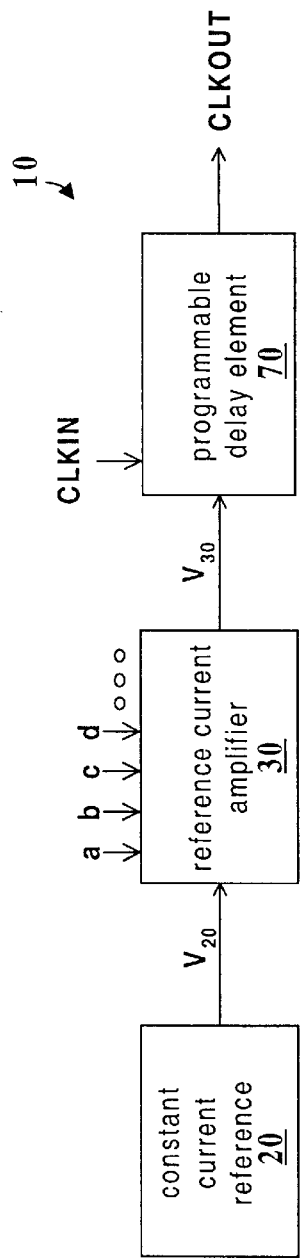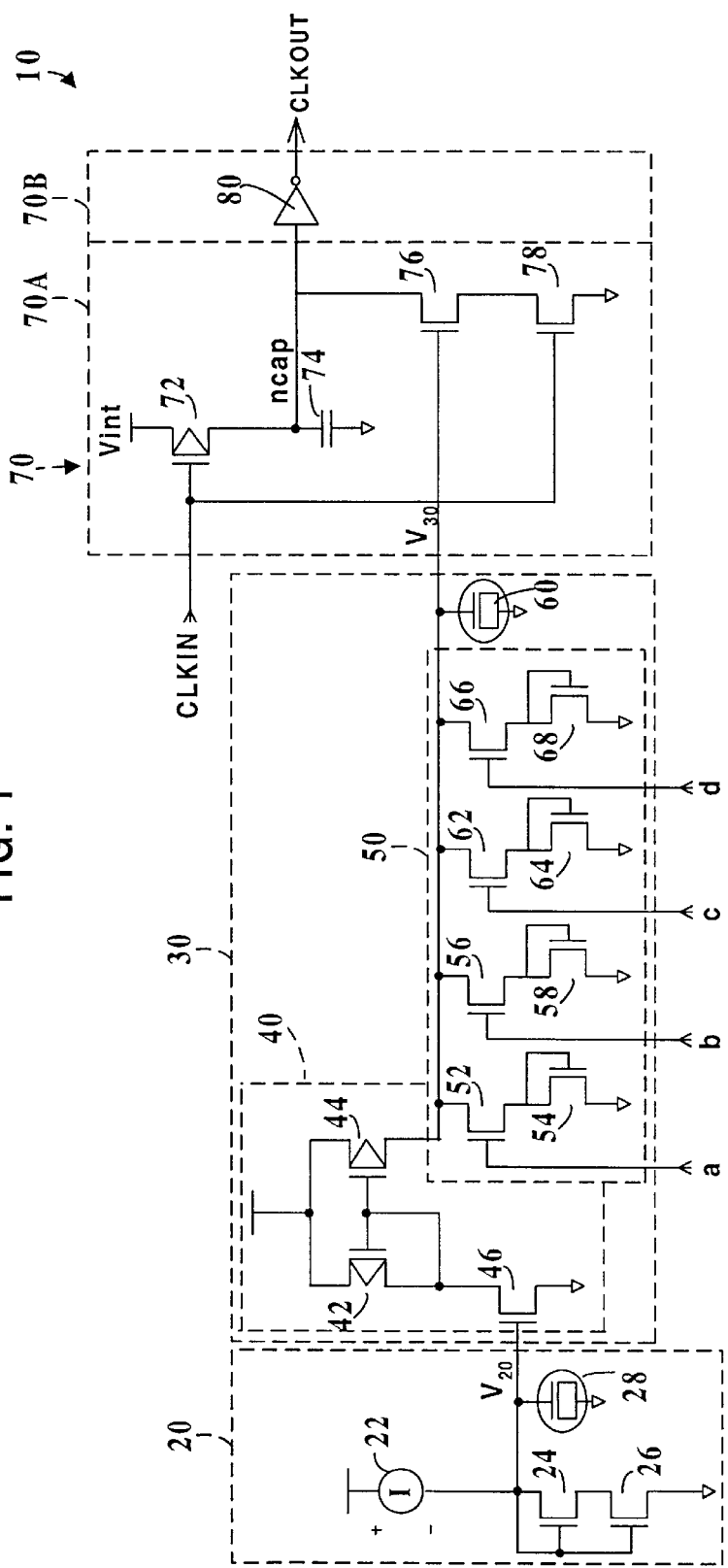
FIG. 1
FIG. 2

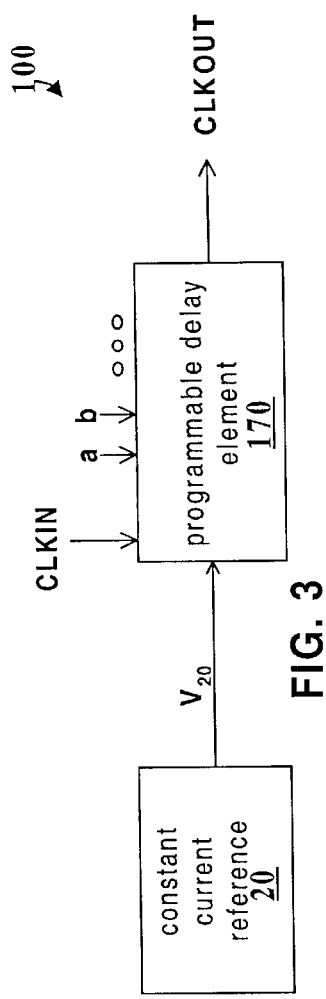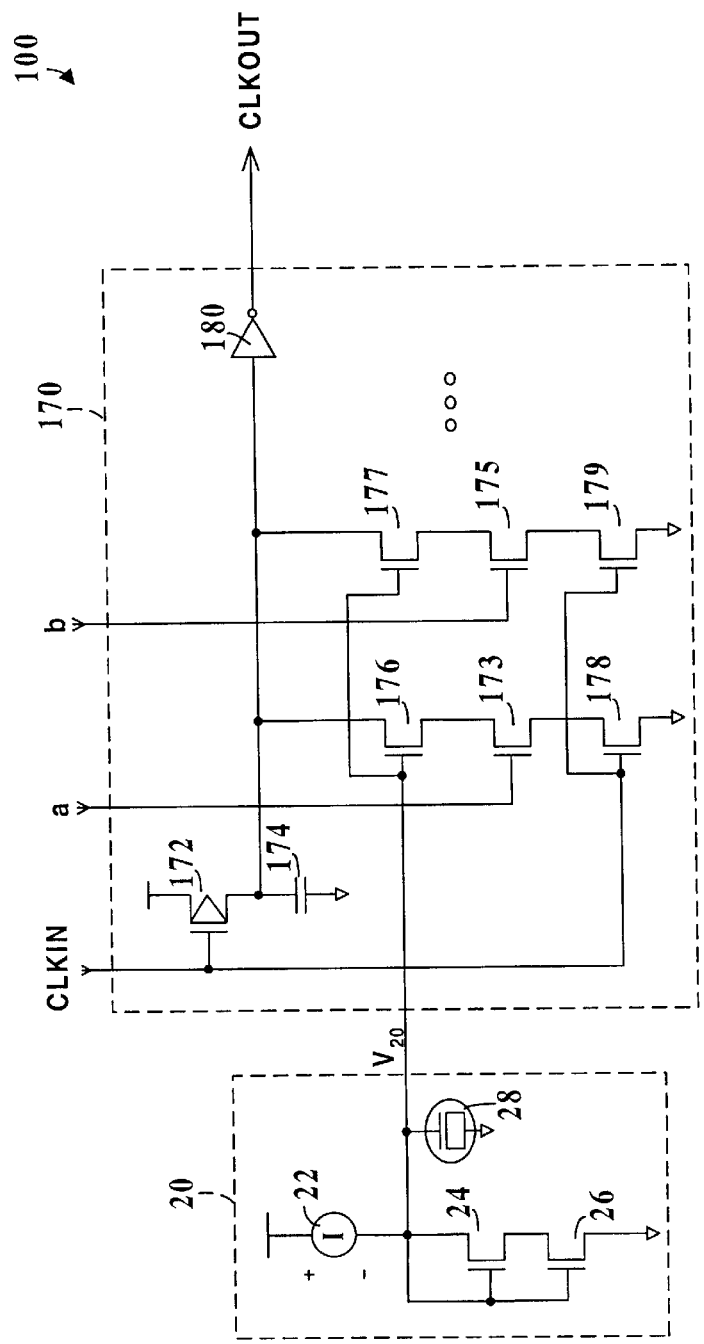

PROGRAMMABLE DELAY ELEMENT AND SYNCHRONOUS DRAM USING THE SAME

BACKGROUND OF THE INVENTION

1. Technical Field

The invention relates generally to electronic circuits and devices, and more specifically, to electronic devices having delay elements.

2. Related Art

Conventional inverter-chain delay lines are used to establish timing relationships between signals on an integrated circuit. These inverter chains, while easy to design, are prone to wide variations in propagation delay due to parametric sensitivities. The parametric sensitivities may include, for example, changes in threshold voltages and gammas due to process tolerances and temperature variations of the inverters. Additionally, it is difficult to design an inverter-chain delay element with programmable delay increments that are of predictable time intervals. If an inverter-chain delay element does include programmable delay increments, it is difficult to preserve the accuracy of the delays and uniformity of the delay steps over process voltage and temperature.

In order to overcome some of the problems of conventional inverter-delay circuits, programmable delay circuits including capacitors and a selection of current sources have been designed. Some examples of these delay circuits are found in the following U.S. Patents: U.S. Pat. No. 5,841,296, "Programmable Delay Element," issued November 1998 to Churcher et al.; U.S. Pat. No. 5,650,739, "Programmable Delay Lines," issued July 1997 to Hui et al.; U.S. Pat. No. 5,081,380, "Temperature Self-Compensated Time Delay Circuits," issued January 1992 to Chen; and U.S. Pat. No. 4,742,331, "Digital-To-Digital Converter," issued May 1988 to Barrow et al.

Unfortunately, the delay elements in most of the aforementioned patents also contain resistors and other elements that are still temperature dependent. Although the temperature variation is compensated for in some circuits, the prediction of the temperature variation takes time, may not be precise, and the compensation circuitry requires more space. The discharge of the capacitance in other circuits is not precise and a programmable delay cannot be produced at predictable time intervals. Furthermore, because of the arrangement of the field-effect transistors (FETs) in some of the aforementioned patents, a certain amount of time is expended for the delay circuit to get out of an unpredictable region (the linear region) to a more predictable region (the saturation region), which ultimately degrades precision of the delay.

Accordingly, a need has developed in the art for a delay element that will not only quickly reach a linear and predictable state of operation, but is substantially resistant to parametric sensitivities.

SUMMARY OF THE INVENTION

It is thus an advantage of the present invention to provide a programmable delay element that is substantially independent of parametric sensitivities, such as temperature variations.

It is also an advantage of the present invention to provide a programmable delay element that will quickly reach a linear and predictable state of operation.

It is also an advantage of the present invention to provide a programmable delay pulse generator that is substantially immune to noise.

The foregoing and other advantages of the invention are realized by a programmable delay element having a current source field-effect transistor (FET), a switch device, a precharge device, and an inverter device. The current source FET gates a programmable, predetermined amount of current. The switch device, which is coupled to the current source FET, receives an input signal having a first and second voltage level. The precharge device precharges the node coupled to the drain of the current source FET when the input signal is at a second voltage level. The inverter device, which is also coupled to the drain of the current source FET, outputs a delayed signal when the input signal is at a first voltage level, wherein the delay of the delayed signal is defined by the programmable, predetermined amount of current.

Generally, the present invention provides a programmable delay device comprising:

a current source field-effect transistor (FET) for gating a predetermined amount of current;

a switch device, coupled to said current source FET, for receiving an input signal having a first and second voltage level; and an inverter device, coupled to the drain of said current source FET, for outputting a delayed signal when said input signal is at said first voltage level, a delay of said delayed signal defined by said predetermined amount of current.

In addition, the present invention provides a method for delaying an input signal comprising the steps of:

a) precharging a capacitance node when an input signal is at a first voltage level;

b) discharging said capacitance node by gating a predetermined amount of current through a current source FET when said input signal is at a second voltage level;

c) defining a delayed signal by said predetermined amount of current and said discharging of said capacitance node; and d) outputting, with an inverter device coupled to a drain of said current source FET, said delayed signal.

The present invention also provides a system having a programmable delay pulse generator comprising:

a programmable delay device for receiving an input signal, producing a predetermined amount of current and outputting a first delayed signal;

a signal lock-out delay element for receiving said input signal and outputting a second delayed signal;

a pulse trigger device, coupled to said programmable delay device and said signal lock-out delay element, for receiving said first and second delayed signal, wherein said second delayed signal prevents said pulse trigger device from receiving said first delayed signal within a predetermined time period;

an output device, coupled to said pulse trigger device, for receiving a pulse from said pulse trigger device and outputting a delayed signal; and a reset device, coupled to said pulse trigger device and said output device, for resetting said pulse trigger device and said output device.

The present invention further provides a system having a data input, a first latch and a second latch, said system optimized to transfer said data input to said second latch in a minimum number of clock cycles, said system comprising:

a first clock;

a second clock; and a programmable delay device, for delaying said first clock to latch said data input with said first latch within a predetermined amount of time and output a first latched data to said second latch, wherein said predetermined amount of time enables said first latched data to be latched with said second latch to coincide with a specific clock cycle of said second clock.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and wherein:

FIG. 1 is a block diagram of a programmable delay device in accordance with a preferred embodiment of the present invention;

FIG. 2 is a circuit diagram of the programmable delay device of FIG. 1;

FIG. 3 is a block diagram of a programmable delay device in accordance with a second embodiment of the present invention;

FIG. 4 is an exemplary circuit diagram of the programmable delay device of FIG. 3;

DETAILED DESCRIPTION OF THE DRAWINGS

Figure 5:
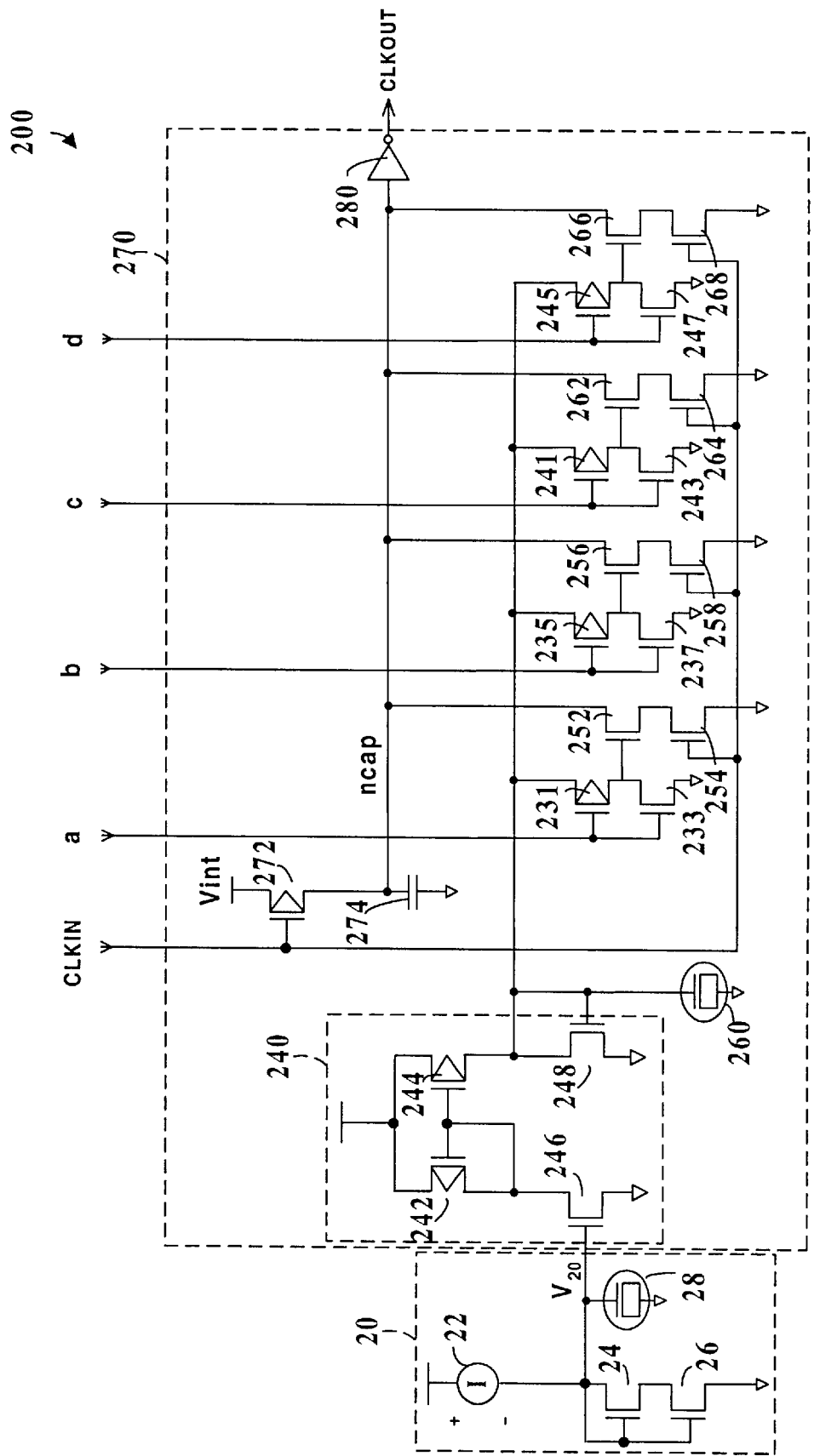
FIG. 5 is a second example of a circuit diagram of the programmable delay device of FIG. 3.

FIG. 1 illustrates a block diagram of programmable delay device 10 having a constant current reference 20, a reference current amplifier 30, and a programmable delay element 70 in accordance with a preferred embodiment of the present invention. Constant current reference 20 provides voltage $V_{20}$, which reflects a constant current, to reference current amplifier 30. Programmable inputs a, b, c, and d are inputted into reference current amplifier 30, which outputs a reference current, reflected by voltage $V_{30}$, to programmable delay element 70. Programmable delay element 70 receives both voltage $V_{30}$ and input clock CLKIN, and outputs an output clock CLKOUT, which is delayed from CLKIN by a predictable and adjustable amount. As will be discussed in more detail with reference to FIG. 2, advantages of the programmable delay device 10 of the present invention include, inter alia, that CLKIN may be delayed a predictable and adjustable amount based on programmable inputs a, b, c, and d, and that the delay is substantially independent of parametric factors such as temperature variation and threshold voltage. Although only four programmable inputs are shown in this and subsequent figures, and two programmable inputs are shown in other figures, the present invention is not limited to any specific number of programmable inputs.

FIG. 2 illustrates the circuit diagram of the programmable delay device 10 illustrated in FIG. 1. In the preferred embodiment of the present invention, constant current reference 20 may be derived from an on-chip band-gap circuit, which is discussed in greater detail in U.S. Pat. No. 5,545,978, incorporated herein by reference. Other circuits may also be used to implement the constant current reference 20. Constant current reference 20, as a band-gap equivalent circuit, comprises current source 22, n-type field-effect transistors (NFETs) 24 and 26, and filter capacitor 28. Current source 22 is coupled to the drain and gate of NFET 24, the gate of NFET 26 and to filter capacitor 28. The source of NFET 24 is coupled to the drain of NFET 26. The source of NFET 26 is tied to ground. Examples of numerical values for the components of the constant current reference 20 include, but are not limited to: current source 22 equaling 1.5 microamps ($\mu$A); NFETs 24 and 26 having a beta of 4.8/8; and filter capacitor 28 having a capacitance of 10 picofarads (pF). Through this arrangement, constant current reference 20 provides a constant, stable current of 1.5 $\mu$A (reflected by the voltage $V_{20}$) to reference current amplifier 30.

Reference current amplifier 30 includes a current mirror 40 comprising an NFET 46 and a pair of p-type field-effect transistors (PFETs) 42 and 44. Reference current amplifier 30 also comprises four selectable binary weighted reference diodes 50, including NFETs 52, 54, 56, 58, 62, 64, 66 and 68, and a filter capacitor 60. The sources of PFETs 42 and 44 are tied together and are connected to voltage Vint. The gates of PFETs 42 and 44 are tied together and are connected to the drain of PFET 42 and the drain of NFET 46. The gate of NFET 46 is coupled to current source 22 of constant current reference 20. The source of NFET 46 is tied to ground. The drain of PFET 44 is coupled to filter capacitor 60, and to the drains of NFETs 52, 56, 62 and 66. The gates of NFETs 52, 56, 62 and 66 are coupled to programmable inputs a, b, c, and d, respectively. The sources of NFETs 52, 56, 62 and 66 are coupled to the drains and gates of NFETs 54, 58, 64 and 68, respectively, with each leg (e.g., NFET 52 and NFET 54) forming a selectable binary weighted reference diode. The sources of NFETs 54, 58, 64, and 68 are tied to ground. Programmable inputs a, b, c, and d may be preset through a mask pattern, laser fuses or other fuse elements, modulation of off-chip pad connections, through configurations of registers, and/or other appropriate methods.

Examples of numerical values for the components of the reference current amplifier 30 include, but are not limited to: NFET 46 having a beta of 2.4/8; PFET 42 having a beta of 1/1; PFET 44 having a beta of 2/1; NFETs 52, 56, 62 and 66 having betas of 16/1; NFET 54 having a beta of 2/16; NFET 58 having a beta of 4/16; NFET 64 having a beta of 8/16; NFET 68 having a beta of 16/16; and filter capacitor 60 having a capacitance of 10 pF. Because of current mirror 40 and selectable binary weighted reference diodes 50, reference current amplifier 30 can precisely control how much current will go to programmable delay element 70 based on the inputs a, b, c and d.

Programmable delay element 70 comprises PFET 72, trim capacitor 74, NFETs 76 and 78, and inverter 80. The source of PFET 72 is tied to Vint. The gate of PFET 72 is coupled to the gate of NFET 78 and clock input CLKIN. The drain of PFET 72 is coupled to trim capacitor 74, the drain of NFET 76 and to the input of inverter 80, forming node ncap. The gate of NFET 76 is tied to the drain of PFET 44 of reference current amplifier 30, wherein NFET 76 functions as a current source for programmable delay element 70. The source of NFET 76 is coupled to the drain of NFET 78, which functions as a CLKIN enable switch. The source of NFET 78 is tied to ground. The relative placement of NFET 76 to NFET 78 is an advantage of the present invention, wherein NFET 76 may quickly advance to the saturated region, where the discharge of node ncap is highly linear, instead of staying in the unpredictable linear region. Therefore, the majority of discharge time of ncap may be in the saturated region and any progression of delay as a function of binary selection of reference diodes 50 would also be highly linear.

Inverter 80 outputs CLKOUT. As will be seen and discussed in subsequent figures, programmable delay element 70 may be designated by 70A and 70B, wherein the function of inverter 80 (70B) may be integrated into an existing logic gate to provide the benefits of the programmable delay element without causing an insertion delay of inverter 80. Examples of numerical values for programmable delay element 70 include, but are not limited to: PFET 72 having a beta of 32/1; trim capacitor having a capacitance of 50 femtofarads (fF); NFET 76 having a beta of 64/1; NFET 78 having a beta of 24/1; and inverter 80 having a PFET/NFET ratio of 8/25, that is, the inverter comprises a PFET, and an NFET having a beta substantially larger than the beta of the PFET. The unbalanced beta ratio of inverter 80 creates an inverter switch point that is substantially independent of temperature variations, which, as described above, is an advantage of the present invention.

In operation, constant current reference 20 supplies a constant current, reflected by $V_{20}$, to reference current amplifier 30. The current is then established in NFET 46, reflected in PFET 42, and amplified according to the beta ratios of PFET 42 and PFET 44, resulting in an amplified current flowing in PFET 44. The amplified current is modulated through selectable binary weighted reference diodes 50 and programmable inputs a, b, c and d. In this example, sixteen different combinations may be used to incrementally and linearly create a reference current, which is reflected through $V_{30}$. That is, the more diodes that are turned on through the selection of the programmable inputs, the lower $V_{30}$ will be. As previously described, because of the selectable binary weighted reference diodes 50 and current mirror 40, reference current amplifier 30 can precisely control how much current will be reflected in programmable delay element 70 based on programmable inputs a, b, c and d.

The input clock to be delayed, (i.e., CLKIN) is inputted into programmable delay element 70. While CLKIN is low, PFET 72 precharges trim capacitor 74 and the capacitance at ncap to Vint. NFET 78 is switched off. Then, when CLKIN is high, PFET 72 is cut off, NFET 78 is switched on and a predetermined amount of current is gated through current source NFET 76 and CLKIN enable switch NFET 78.

The current that is gated through NFET 76 is highly predictable through the following equation:

$$I_N = (\beta_{N76}/\beta_D) * I_{P44}$$

wherein:
$I_N$=current gated through NFET 76;
$\beta_{N76}$=beta of NFET 76;
$\beta_D$=beta of the selected binary weighted reference diodes 50; and
$I_{P44}$=current flowing through PFET 44.

As previously described, the current gated through NFET 76 and the discharge of ncap is highly linear, because of the rapidity with which NFET 76 enters the saturated region.

The delay of CLKIN is predicted by the following equation:

$$t = (C_{ncap} * (Vint - V_{sp}))/I_N$$

wherein:
t=delay of CLKIN;
$C_{ncap}$=capacitance at node ncap;
Vint=voltage Vint;
$V_{sp}$=voltage of the switch point of inverter 80; and
$I_N$ current gated through NFET 76.

FIG. 3 illustrates a block diagram of a programmable delay device 100 having constant current reference 20 and programmable delay element 170 in accordance with a second embodiment of the present invention. As in the previous figures, FIG. 3 shows a constant current reference 20 outputting a constant current, which is reflected by voltage $V_{20}$. Programmable delay element 170 receives voltage $V_{20}$, programmable inputs a and b, and input clock CLKIN, and outputs an output clock CLKOUT, which is delayed from CLKIN by a predictable and adjustable amount.

The circuit diagram of programmable delay device 100 of FIG. 3 is illustrated in FIG. 4. Constant current reference 20 is discussed in detail with reference to FIG. 2. Programmable delay element 170 is similar to programmable delay element 70 of FIG. 2, except that instead of receiving a modified current from a reference current amplifier, programmable delay element 170 receives the constant current, reflected by $V_{20}$, from constant current reference 20. Programmable inputs a and b, and corresponding programming select switches NFETs 173 and 175, select which leg (or legs), comprising a current source (i.e., NFET 176 or NFET 177) and accompanying CLKIN enable switch device (i.e., NFET 178 or NFET 179), are to be used for programmable delay element 170.

As seen in FIG. 4, devices 172, 174 and 180 are similar to 72, 74, and 80, respectively of FIG. 2. The gates of NFETs 176 and 177 are coupled to constant current reference 20, wherein NFETs 176 and 177 function as current sources for programmable delay element 170. The drains of NFETs 176 and 177 are coupled to the drain of PFET 172. The sources of NFETs 176 and 177 are coupled to the drains of NFETs 173 and 175, respectively. The gates of NFETs 173 and 175 are coupled to programmable inputs a and b, respectively, wherein NFETs 173 and 175 function as programming select switches for NFETs 176 and 177, respectively. The sources of NFETs 173 and 175 are coupled to the drains of NFETs 178 and 179, respectively. The sources of NFETs 178 and 179 are tied to ground. The gates of NFETs 178 and 179 receive the CLKIN input, wherein NFETs 178 and 179 function as CLKIN enable switches for NFETs 176 and 177, respectively.

FIG. 5 illustrates a second example of a circuit diagram of a programmable delay device 200 similar to the programmable delay device 100 of FIG. 3. Constant current reference 20 is discussed in detail with reference to FIG. 2. Programmable delay element 270 is similar to both the programmable delay element 70 and reference current amplifier 30 of FIG. 2, except that programmable inputs a, b, c and d are used to select corresponding current sources (i.e., NFETs 252, 256, 262 or 266) and CLKIN enable switches (i.e., NFETs 254, 258, 264, and 268) through pass devices and ground switches (e.g., PFET 231 and NFET 233, which correspond to NFET 252 and NFET 254). A plurality of programmable select switches FETs are formed by the combination of pass devices (including PFETs 231, 235, 241, and 245) and corresponding ground switches (including NFETs 233, 237, 243, and 247). In FIG. 5, two devices are in series in a leg as opposed to FIG. 4, where three devices are in series in a leg.

Programmable delay element 270 of FIG. 5 comprises current mirror 240 having NFETs 246 and 248 and PFETs 242 and 244, filter capacitor 260, PFET 272, trim capacitor 274, inverter 280, pass devices including PFETs 231, 235, 241 and 245 and corresponding ground switches including NFETs 233, 237, 243, and 247, respectively, current sources including NFETs 252, 256, 262 and 266, and corresponding CLKIN enable switches including NFETs 254, 258, 264 and 268. The sources of PFETs 242 and 244 are tied together and to voltage Vint. The gates of PFETs 242 and 244 are tied together and are connected to the drain of PFET 242 and the drain of NFET 246. The gate of NFET 246 is coupled to current source 22 of constant current reference 20. The source of NFET 246 is tied to ground. The drain of PFET 244 is coupled to filter capacitor 260, to the drain and gate of NFET 248, and to the sources of PFETs 231, 235, 241 and 245. The source of NFET 248 is tied to ground.

The drains of PFETs 231, 235, 241 and 245 are coupled to the drains of NFETs 233, 237, 243, and 247, respectively. The drains of PFETs 231, 235, 241 and 245 are also coupled to the gates of NFETs 252, 256, 262, and 266, respectively. The sources of NFETs 233, 237, 243 and 247 are tied to ground. The gates of PFETs 231, 235, 241 and 245 and corresponding gates of NFETs 233, 237, 243 and 247 are coupled to programmable inputs a, b, c, and d, respectively. The sources of NFETs 252, 256, 262 and 266 are coupled to the drains of NFETs 254, 258, 264 and 268, respectively. The gates of NFETs 254, 258, 264 and 268 receives the clock input CLKIN. The sources of NFETs 254, 258, 264, and 268 are tied to ground. Each leg comprises a pass device, a ground switch, a current source and a CLKIN enable switch (e.g., PFET 231, NFET 233, NFET 252 and NFET 254).

The source of PFET 272 is tied to Vint. The gate of PFET 272 receives the clock input CLKIN. The drain of PFET 272 is coupled to trim capacitor 274, the drains of NFETs 252, 256, 262, and 266, and to the input of inverter 280, forming node ncap. The output of inverter 280 outputs the delayed clock CLKOUT.

Although in the preferred embodiment, elements are disclosed with specific PFET and NFET configurations, it will be understood by those skilled in the art that the transposition of NFET to PFET and PFET to NFET with corresponding connections and clock input signals is also within the scope of this invention.

Figure 6:
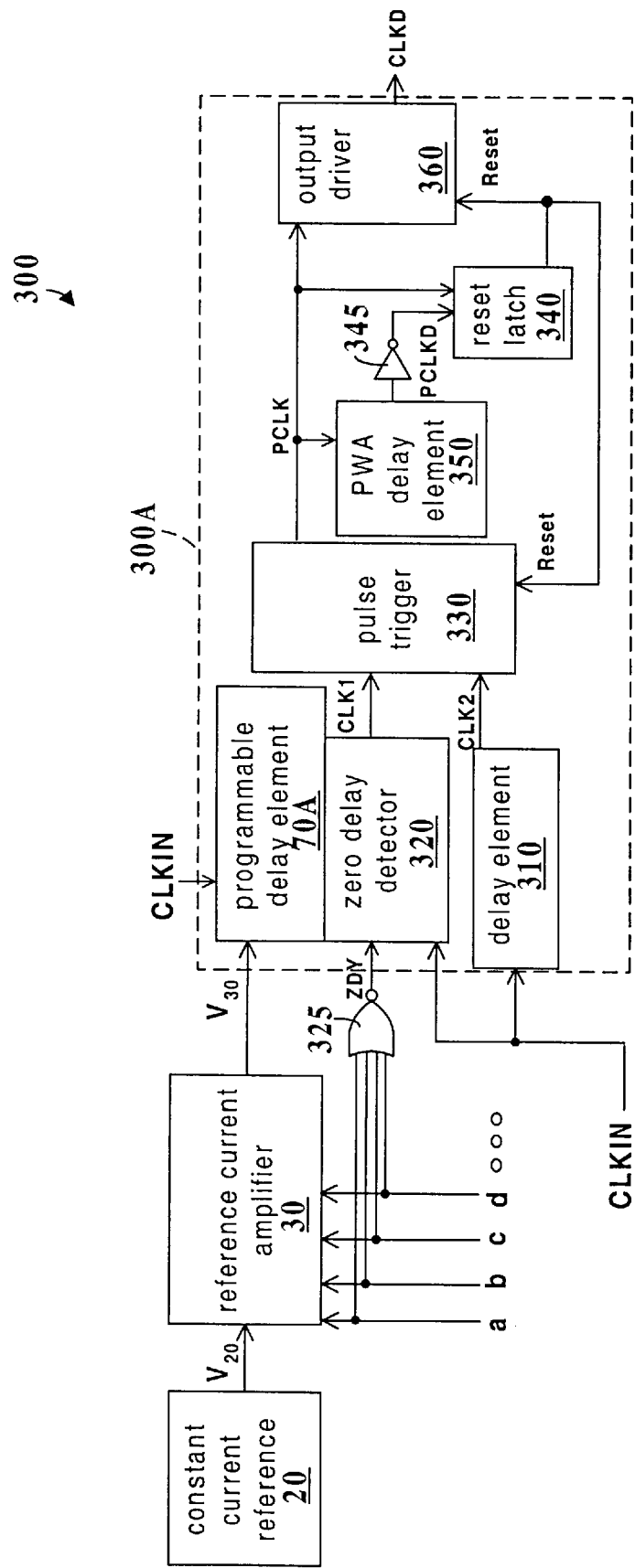
FIG. 6 is a block diagram of a programmable delay pulse generator using the programmable delay device of FIG. 1.
Figure 7:
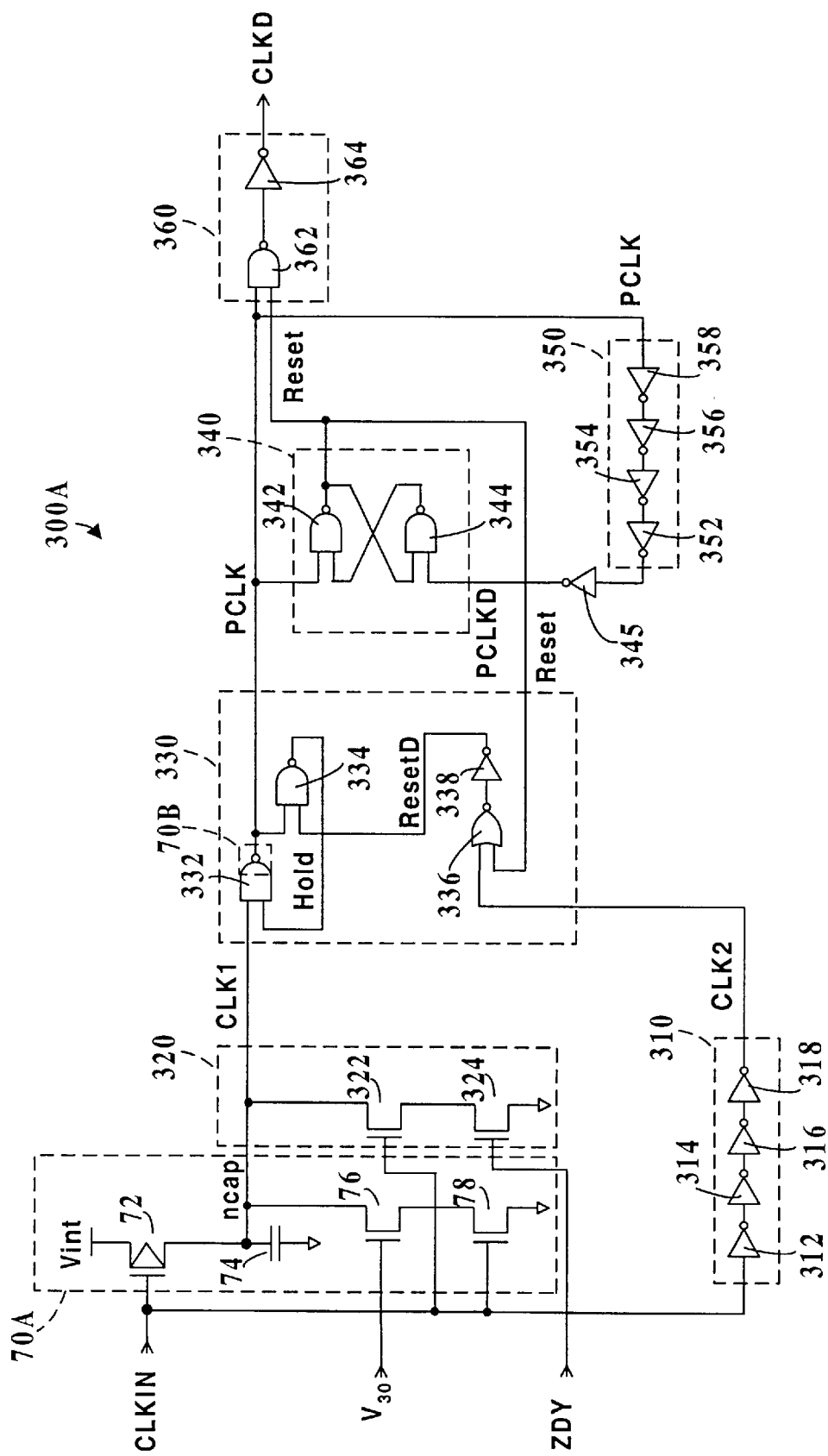
FIG. 7 is a circuit diagram of the programmable delay pulse generator of FIG. 6.

As seen in FIGS. 6 and 7, a programmable delay element 70A and 70B (which is incorporated into existing logic gate 332) may be used in a one-shot clock pulse generator to allow for a programmable delay pulse generator 300 and output clock CLKD that is highly immune to noise.

FIG. 6 illustrates a block diagram for programmable delay pulse generator 300 comprising constant current reference 20, reference current amplifier 30, programmable delay element 70A, zero delay detector 320, NOR gate 325, delay element 310, pulse trigger 330, pulse width adjustment (PWA) delay element 350, inverter 345, reset latch 340 and output driver 360. Constant current reference 20, reference current amplifier 30 and programmable delay element 70A are discussed in detail with reference to FIG. 2. Zero delay detector 320 is coupled to programmable delay element 70A and receives the NORed programmable inputs a, b, c, and d (ZDY) from NOR gate 325 and clock input CLKIN. Programmable delay element 70A and zero delay detector 320 provide clock output CLK1. Delay element 310 outputs a delayed clock CLK2 from input CLKIN. Pulse trigger 330 receives CLK1 and CLK2 and a reset signal (Reset) from reset latch 340 and outputs a pulse trigger clock PCLK. PWA delay element 350 receives PCLK and outputs a delayed PCLK (PCLKD), which is inverted through inverter 345 and inputted into reset latch 340. Reset latch 340 also receives PCLK from pulse trigger 330 and outputs Reset. Output driver 360 receives PCLK from pulse trigger 330 and Reset from reset latch 340 and outputs a delayed clock output CLKD. As will be discussed in more detail with reference to FIG. 7, an advantage of the programmable delay pulse generator 300, which includes the programmable delay device of the present invention, is that the output clock CLKD is highly predictable and the programmable delay pulse generator 300 has a high noise immunity.

FIG. 7 illustrates the circuit diagram for region 300A of the programmable delay pulse generator 300. As aforementioned, programmable delay element 70A is discussed in detail with reference to FIG. 2. Furthermore, programmable delay element 70 (FIG. 2) is designated as 70A and 70B, wherein the function of inverter 80 (70B) is incorporated into NAND gate 332 of pulse trigger 330 to provide the benefits of programmable delay element 70 without causing an insertion delay of inverter 80.

Zero delay detector 320 comprises NFETs 322 and 324. The drain of NFET 322 is coupled to the node ncap. The gate of NFET 322 receives input CLKIN. The source of NFET 322 is coupled to the drain of NFET 324. The gate of NFET 324 receives input ZDY and the source of NFET 324 is tied to ground. The purpose of zero delay detector 320 is to detect if no delay is desired (through programmable inputs a, b, c, d) and to shunt the current source NFET 76 of programmable delay element 70A if this is the case. Thus, programmable delay element 70A is essentially bypassed for no delay.

Delay element 310 comprises conventional inverter-chain delay elements 312, 314, 316, and 318. Delay element 310 provides a clock lock-out period for pulse trigger 330, which will be discussed in more detail with regard to the operation of pulse trigger 330. In this invention, delay element 310 may be a conventional inverter-chain delay element, or similar delay element since precision of the delay of CLKIN is not vital for providing the lock-out period. Delay element 310 outputs delayed clock CLK2.

Pulse trigger 330 comprises NAND gates 332 and 334, inverter 338 and NOR gate 336. NAND gate 332 receives CLK1 from zero delay detector 320 and the input HOLD from NAND gate 334. NAND gate 332 outputs PCLK. PCLK is inputted into an input of NAND gate 334. The other input of NAND gate 334 is coupled to inverter 338 and receives ResetD signal from inverter 338. The input of inverter 338 is coupled to the output of NOR gate 336. NOR gate 336 receives inputs CLK2 from delay element 310, and Reset from reset latch 340. As previously described, the function of inverter 80 (FIG. 2) is incorporated into NAND gate 332; the function comprising an unbalanced beta ratio, creating an inverter switch point that is substantially independent of temperature variations.

Reset latch 340 includes NAND gates 342 and 344. The inputs of NAND gate 342 are coupled to the output of NAND gate 344 and to the output of NAND gate 332 to receive the input PCLK. NAND gate 342 outputs the Reset signal, and is coupled to an input of NAND gate 344, to an input of NOR gate 336 of pulse trigger 330 and to an input of NAND gate 362 of output driver 360. The second input of NAND gate 344 is coupled to inverter 345 and receives the input PCLKD therefrom.

PWA delay element 350 may also be a conventional inverter-chain delay line or other appropriate delay line, similar to delay element 310. PWA delay element 350 comprises inverters 352, 354, 356 and 358, connected in series. The output of inverter 352 is coupled to inverter 345.

Output latch 360 comprises NAND gate 362 and inverter 364. The input of NAND gate 362 receives PCLK and Reset. The output of NAND gate 362 is coupled to the input of inverter 364. Inverter 364 outputs the delayed clock CLKD.

In operation, programmable delay element receives CLKIN and outputs a falling edge clock CLK1 that is delayed according to the programmable inputs as reflected by $V_{30}$. If no delay is desired, zero delay detector 320 shunts the current source NFET 76 of programmable delay element 70A and programmable delay element 70A is essentially bypassed, wherein the timing of CLK1 is substantially equal to the timing of CLKIN. CLK1 triggers pulse trigger 330, which causes the signal HOLD to go low, guaranteeing the output signal PCLK to stay high until NAND gate 334 is reset by ResetD at a later time (determined by both delay element 310 and reset latch 340). Delay element 310 guarantees a lockout period for pulse trigger 330 so that extraneous noise occurring on the falling edge of CLKIN will not cause a glitch in pulse trigger 330. Output driver 360 then drives signal CLKD high in response to PCLK going high, which begins the CLKD pulse.

PCLK is delayed by PWA delay element 350 and inverted to produce PCLKD. PCLKD causes the Reset signal of reset latch 340 to go low, which ends the CLKD pulse by turning off output driver 360. When Reset goes low, ResetD of pulse trigger 330 will also go low, which will reset pulse trigger 330 when CLK2 is also low. At this point, programmable delay pulse generator 300 is ready for another cycle. Thus, with elements of programmable delay pulse generator 300, such as delay element 310, pulse trigger 330, and PWA delay element 350, programmable delay pulse generator 300 will ignore the clock input until the output is complete, allowing for excellent noise immunity on both positive and negative clock edges. That is, pulse trigger 330 provides excellent positive noise immunity, and delay elements 310 and 350 allow for excellent negative noise immunity. Furthermore, with programmable delay element 70, accurate predictions of delay clock CLKD may be made for optimizing programmable delay pulse generator 300 in a synchronous dynamic random access memory (SDRAM) system as will be discussed with regard to FIG. 8.

Figure 8:
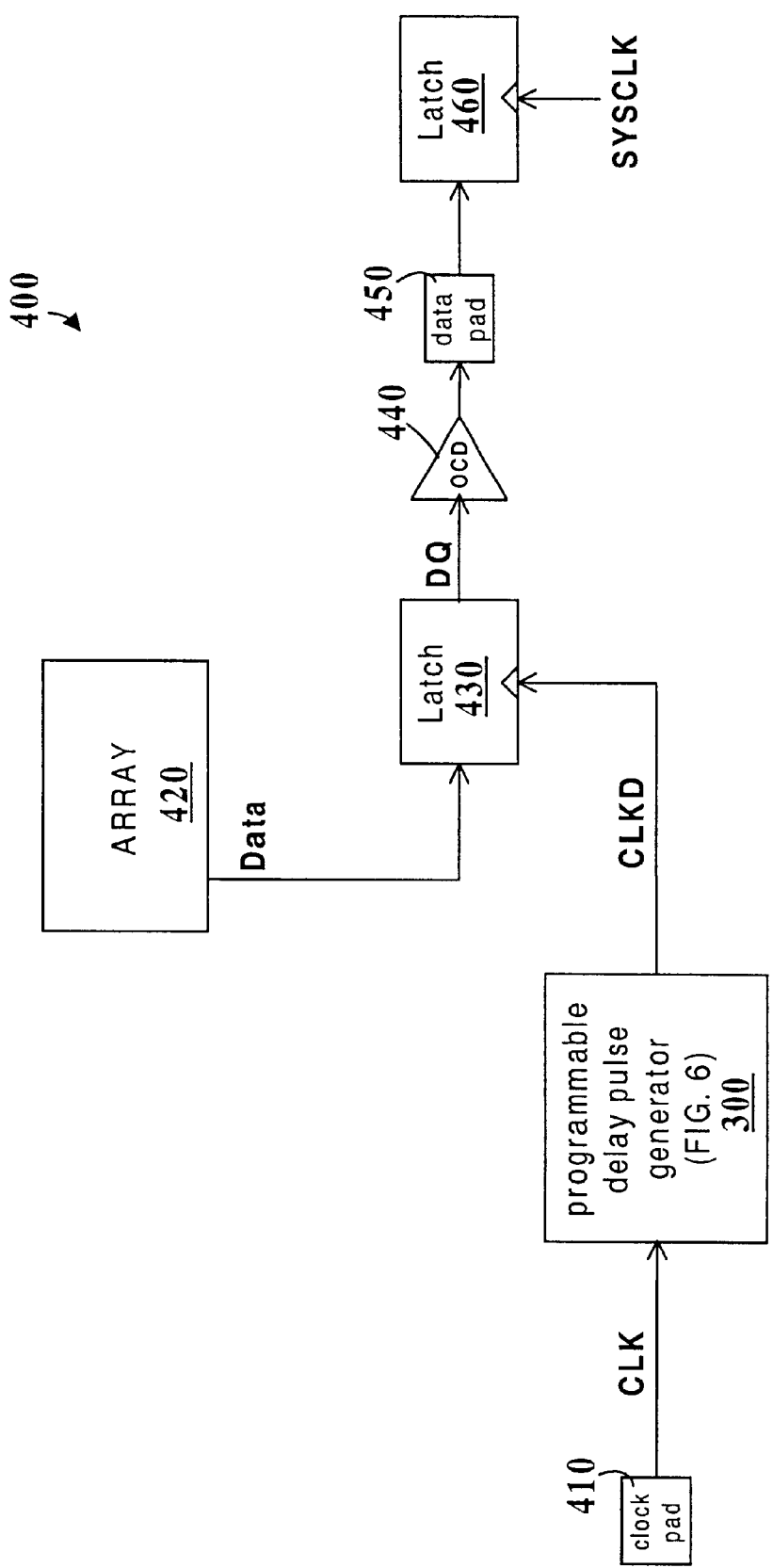
FIG. 8 is a block diagram of a SDRAM system using the programmable delay pulse generator of FIG. 6 in accordance with the present invention.

FIG. 8 illustrates programmable delay pulse generator 300 used in a SDRAM system 400 or similar system. In addition to programmable delay pulse generator 300, SDRAM system 400 comprises clock pad 410, latch 430, array 420, off-chip driver (OCD) 440, data pad 450, and latch 460. Programmable delay pulse generator 300 receives an input clock CLK from clock pad 410 and outputs CLKD. Data from array 420 enters latch 430 and is clocked out of latch 430 by CLKD from programmable delay pulse generator 300. The latched data DQ is then driven by off-chip driver 440 to latch 460 through data pad 450. The system clock SYSCLK latches DQ into latch 460.

With the SDRAM system 400 of the present invention, data is transferred to latch 460 in a minimum number of clock cycles of SYSCLK. That is, the programmable pulse generator 300 comprising programmable delay element 70A (FIG. 6) delays CLK so that the data from array 420 may be latched at latch 430 essentially upon arrival, and, if desired, within a predetermined amount of time to coincide with the next clock cycle of SYSCLK. DQ then arrives at latch 460 within that predetermined amount of time, determined by CLKD, which enables the data to be latched with latch 460 at the earliest possible clock cycle of SYSCLK.

Thus, an advantage of using the programmable delay pulse generator 300 of the present invention in an SDRAM system, such as system 400, is that CLKD may be adjusted easily and predictably to allow asynchronous data to be latched and outputted in the earliest possible clock cycle. That is, a certain amount of time, the access time (Tac), is allowed for data to be latched and outputted to the data pad. The number of clock cycles it actually takes for the data to be latched and outputted to the data pad is known as the Column Address Strobe (CAS) latency. Thus, as long as the allowed Tac is being met, the longer the clock pulse CLKD can be delayed, so that fewer clock cycles are necessary to delivery the data, the lower the CAS latency is, which is desirable for system performance. Furthermore, if the CAS latency does not meet the allowed Tac, the delayed clock CLKD may be easily and inexpensively adjusted so that a chip having the SDRAM system of the present invention or similar system may be down-sorted to a higher CAS latency and be sold at a lower price. Hence, the programmable delay element 70 may be adjusted during the module test to satisfy both requirements of Tac and CAS latency by means of electronic fuses or configuration registers.

Other advantages of using the programmable delay pulse generator 300 of the present invention in an SDRAM or similar system include: the adjusting of the timing of CLK to center a clock pulse for data, address, or command set-up and hold; the optimizing of an OCD clock for determining the trade-off between data access time (Tac) and data output hold time; and the adjusting of the skew between two signals in any synchronous system.

Thus, this invention provides a programmable delay element that produces a highly predictable delayed output clock, substantially independent of parametric elements such as temperature variations and threshold voltage. In addition, this delay element may be used as a standard cell in a logic design library, in which the programming and delay may be changed with minimal design effort. Furthermore, this invention allows for a programmable clock delay pulse generator with excellent noise immunity.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A programmable delay device comprising:
   a plurality of current source field-effect transistors (FETs) for gating a predetermined amount of current;
   a switch device, coupled to said plurality of current source FETs, for receiving an input signal having a first and second voltage level;
   a plurality of signal enable switch FETs for receiving said input signal;
   a plurality of programmed select switch FETS, each of said plurality of signal enable switch FETs coupled to both a corresponding programmed select switch FET and a corresponding current source FET, for receiving programmable inputs,
      wherein said programmed select switch FETs activate selected current source FETs for determining said predetermined amount of current; and
   an inverter device, coupled to the drain of said current source FET, for outputting a delayed signal when said input signal is at said first voltage level, a delay of said delayed signal defined by said predetermined amount of current.

2. The delay device of claim 1, wherein said plurality of programmed select switch FETs further comprises:

a plurality of pass device FETs, each of said plurality of pass device FETs coupled to the gates of corresponding current source FETs, for receiving programmable inputs; and a plurality of ground switch FETs, each of said plurality of ground switch FETs coupled to a corresponding pass device FET, wherein said programmable inputs determine said predetermined amount of current by selecting which of said current source FETs to activate.

3. A programmable delay device comprising:

a current source field-effect transistor (FET) for gating a predetermined amount of current;

a switch device, coupled to said current source FET, for receiving an input signal having a first and second voltage level;

an inverter device, coupled to the drain of said current source FET, for outputting a delayed signal when said input signal is at said first voltage level, a delay of said delayed signal defined by said predetermined amount of current;

a constant current reference; and a reference current amplifier, coupled to said constant current reference and said current source FET, for receiving a constant current from said constant current reference and for receiving programmable inputs, wherein said programmable inputs determine said predetermined amount of current.

4. The delay device of claim 3, wherein said reference current amplifier further comprises:

selectable binary weighted reference devices, wherein a reference level of said constant current is selected through said programmable inputs and said selectable binary weighted reference devices, and said selected reference level modulates said current source FET, determining said predetermined amount of current.

5. The delay device of claim 3, wherein said constant current reference is derived from an on- chip band-gap circuit.

6. A method for delaying an input signal comprising the steps of:

a) precharging a capacitance node when an input signal is at a first voltage level;

b) discharging said capacitance node by gating a predetermined amount of current through a current source FET when said input signal is at a second voltage level;

c) receiving programmable inputs and a constant current with selectable binary weighted reference devices;

d) selecting a reference level of said constant current with said programmable inputs and said selectable binary weighted reference devices;

e) modulating said current source FET with said selected reference level;

f) determining said predetermined amount of current with said modulated current source FET;

g) defining a delayed signal by said predetermined amount of current and said discharging of said capacitance node; and h) outputting, with an inverter device coupled to a drain of said current source FET, said delayed signal.

* * * * *